(12) United States Patent
Kondo et al.

(10) Patent No.: US 10,873,307 B2
(45) Date of Patent: Dec. 22, 2020

(54) POWER AMPLIFIER CIRCUIT

(71) Applicant: Murata Manufacturing Co., Ltd., Kyoto (JP)

(72) Inventors: Masao Kondo, Kyoto (JP); Satoshi Tanaka, Kyoto (JP); Yasuhisa Yamamoto, Kyoto (JP); Takayuki Tsutsui, Kyoto (JP); Isao Obu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 30 days.

(21) Appl. No.: 16/223,297

(22) Filed: Dec. 18, 2018

(65) Prior Publication Data

US 2019/0190476 A1 Jun. 20, 2019

(30) Foreign Application Priority Data

Dec. 20, 2017 (JP) ................................. 2017-244136
Oct. 5, 2018 (JP) ................................. 2018-189934

(51) Int. Cl.
*H03F 3/04* (2006.01)
*H03G 3/30* (2006.01)
(Continued)

(52) U.S. Cl.
CPC ......... *H03G 3/3042* (2013.01); *H03F 1/0211* (2013.01); *H03F 1/301* (2013.01); *H03F 1/302* (2013.01); *H03F 3/195* (2013.01); *H03F 3/211* (2013.01); *H03F 2200/211* (2013.01); *H03F 2200/222* (2013.01); *H03F 2200/387* (2013.01); *H03F 2200/451* (2013.01); *H03F 2200/48* (2013.01); *H03F 2200/54* (2013.01); *H03F 2203/21103* (2013.01); *H03F 2203/21139* (2013.01); *H03G 2201/106* (2013.01); *H03G 2201/40* (2013.01)

(58) Field of Classification Search
CPC ............. H03G 3/3042; H03G 2201/40; H03G 2201/106; H03F 3/195; H03F 1/0211; H03F 3/211; H03F 2200/211; H03F 2200/387; H03F 2200/451; H03F 2200/48; H03F 2203/21139; H03F 2203/21103; H03F 2200/54; H03F 2200/222
USPC ................................ 330/296, 285, 302, 284
See application file for complete search history.

(56) References Cited

U.S. PATENT DOCUMENTS 6,842,072 B1 1/2005 Cheng et al.
7,417,507 B2 * 8/2008 Yamamoto .............. H03F 3/189
330/289

* cited by examiner

*Primary Examiner* — Khanh V Nguyen
*Assistant Examiner* — Khiem D Nguyen
(74) *Attorney, Agent, or Firm* — Pearne & Gordon LLP

(57) ABSTRACT

A power amplifier circuit includes a first transistor amplifying a first signal; a second transistor amplifying a second signal; a bias circuit supplying a bias current or voltage to a base or gate of the second transistor; and an attenuator attenuating the first or second signal in accordance with a control voltage supplied from the bias circuit. The attenuator includes a first diode to which the control voltage is supplied, a third transistor including a collector connected to a supply path of the first or second signal, an emitter connected to a ground, and a base to which the control voltage is supplied from the first diode, and a capacitor connected in parallel with the first diode. The control voltage decreases as a second signal power level increases. The third transistor allows part of the first or second signal to pass to the emitter in accordance with the control voltage.

11 Claims, 15 Drawing Sheets

(51) Int. Cl.
*H03F 3/21* (2006.01)
*H03F 1/02* (2006.01)
*H03F 3/195* (2006.01)
*H03F 1/30* (2006.01)

POWER AMPLIFIER CIRCUIT

This application claims priority from Japanese Patent Application No. 2017-244136 filed on Dec. 20, 2017 and Japanese Patent Application No. 2018-189934 filed on Oct. 5, 2018. The content of these applications are incorporated herein by reference in their entireties.

BACKGROUND OF THE DISCLOSURE

1. Field of the Disclosure

The present disclosure relates to a power amplifier circuit.

2. Description of the Related Art

In a power amplifier circuit that amplifies a radio frequency (RF) signal, an attenuator is provided to reduce the gain of the power amplifier circuit in a low-power mode in some cases. For example, U.S. Pat. No. 6,842,072 discloses an attenuator connected in shunt with an input path of an RF signal to an amplifier transistor. The attenuator includes a transistor. A voltage applied to a base of the transistor is controlled to switch the transistor between on and off states, thereby controlling an attenuation.

The attenuator disclosed in U.S. Pat. No. 6,842,072 is controlled in accordance with an operation mode so that the transistor included in the attenuator is turned on in a low-power mode and is turned off in a high-power mode. However, the gain of a typical power amplifier circuit decreases continuously as the output power increases. Hence, some configurations in which an attenuator is switched in accordance with an operation mode as described above make it difficult to improve the linearity of gain with high accuracy.

BRIEF SUMMARY OF THE DISCLOSURE

The present disclosure has been made in view of such circumstances to provide a power amplifier circuit that improves the linearity of gain with high accuracy.

To achieve such an objective, a power amplifier circuit according to one preferred embodiment of the present disclosure includes a first transistor configured to amplify a first signal; a second transistor configured to amplify a second signal corresponding to an output signal of the first transistor; a bias circuit configured to supply a bias current or a bias voltage to a base or a gate of the second transistor; and an attenuator configured to attenuate the first signal or the second signal in accordance with a control voltage supplied from the bias circuit. The attenuator includes a first diode including an anode to which the control voltage is supplied, a third transistor including a collector connected to a supply path of the first signal to the first transistor or a supply path of the second signal to the second transistor, an emitter connected to a ground side, and a base to which the control voltage is supplied from a cathode of the first diode, and a capacitor connected in parallel with the first diode. The control voltage is a voltage that decreases as a power level of the second signal increases. The third transistor allows a part of the first signal or the second signal to pass from the collector to the emitter of the third transistor in accordance with the control voltage supplied to the base of the third transistor.

Preferred embodiments of the present disclosure can provide a power amplifier circuit that improves the linearity of gain with high accuracy.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
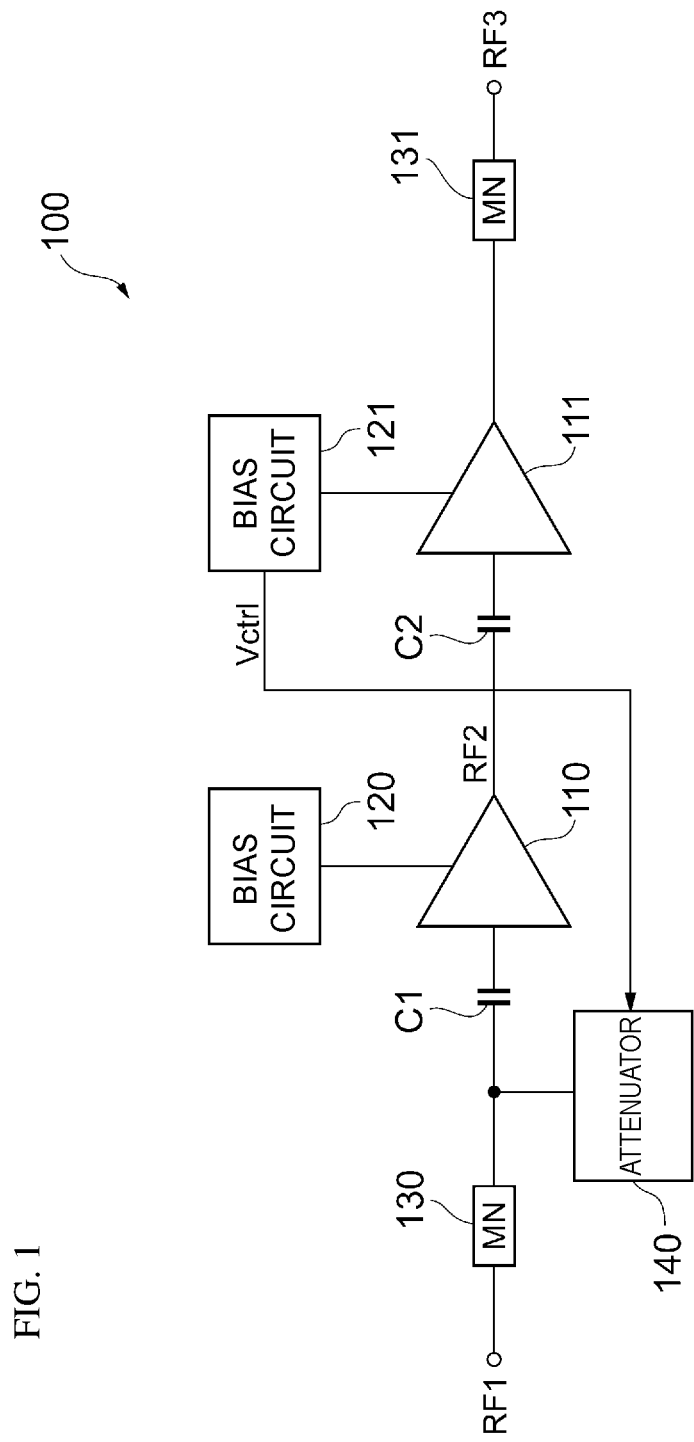
FIG. 1 illustrates an overview of a configuration of a power amplifier circuit according to a first embodiment of the present disclosure.

Embodiments of the present disclosure will be described in detail below with reference to the drawings. Note that elements that are the same are denoted by the same reference numerals, and a repeated description thereof is omitted.

FIG. 1 illustrates an overview of a configuration of a power amplifier circuit according to a first embodiment of the present disclosure. A power amplifier circuit 100 illustrated in FIG. 1 is a circuit that is installed in, for example, a mobile communication device, such as a cellular phone, and that amplifies the power of a radio frequency (RF) signal to a level necessary to transmit the signal to a base station. The power amplifier circuit 100 amplifies a transmission signal of a communication standard, such as a second generation mobile communication system (2G), a third generation mobile communication system (3G), a fourth generation mobile communication system (4G), a fifth generation mobile communication system (5G), long term evolution (LTE)-frequency division duplex (FDD), LTE-time division duplex (TDD), LTE-Advanced, or LTE-Advanced Pro. The frequency of an RF signal ranges from about hundreds of MHz to several tens of GHz, for example. Note that the communication standard and frequency of a signal to be amplified by the power amplifier circuit 100 are not limited to these.

Specifically, the power amplifier circuit 100 includes, for example, amplifiers 110 and 111, bias circuits 120 and 121, matching networks 130 and 131, an attenuator 140, and capacitors C1 and C2.

Each of the amplifiers 110 and 111 amplifies an input RF signal and outputs the amplified RF signal. That is, the power amplifier circuit 100 amplifies power in two stages. Specifically, the first-stage (drive-stage) amplifier 110 amplifies an RF signal RF1 (first signal) inputted from an input terminal via the matching network 130 and outputs an RF signal RF2. The subsequent-stage (power-stage) amplifier 111 amplifies the RF signal RF2 (second signal) supplied from the amplifier 110 and outputs an RF signal RF3. Each of the amplifiers 110 and 111 is constituted by, for example, a bipolar transistor, such as a heterojunction bipolar transistor (HBT), made of a compound semiconductor composed of gallium arsenide (GaAs) or the like. Each of the amplifiers 110 and 111 may be constituted by a metal-oxide-semiconductor field-effect transistor (MOSFET) in place of the HBT. In this case, a collector, a base, and an emitter are to be read as a drain, a gate, and a source, respectively. Hereinafter, as an example, the case where a transistor is an HBT will be described unless otherwise specified.

The bias circuits 120 and 121 supply a bias current or a bias voltage to the respective amplifiers 110 and 111. The bias circuits 120 and 121 adjust a bias current or a bias voltage to thereby control gains of the amplifiers 110 and 111.

The matching network (MN) 130 matches the impedance of a circuit (not illustrated) provided at a previous stage to that of the amplifier 110. The matching network 131 matches the impedance of the amplifier 111 to that of a circuit (not illustrated) provided at a subsequent stage. Although omitted in FIG. 1, the power amplifier circuit 100 may include an interstage matching network between the amplifiers 110 and 111.

The attenuator 140 reduces the gain of the power amplifier circuit 100 when the output power of the power amplifier circuit 100 is relatively small. That is, in a typical power amplifier circuit, due to the performance of a transistor, the gain starts to decrease when the output power exceeds a certain level, and the linearity can deteriorate. To deal with this issue, in the power amplifier circuit 100, the attenuator 140 attenuates, on the basis of a control voltage Vctrl outputted from the bias circuit 121, the RF signal RF1 to be supplied to the amplifier 110 to thereby adjust the gain. Details of attenuation provided by the attenuator 140 will be described later.

The capacitors C1 and C2 are provided at respective inputs of the amplifiers 110 and 111. Each of the capacitors C1 and C2 is a coupling capacitor that blocks a direct-current component included in the RF signal and allows an alternating-current component to pass.

Next, details of attenuation of an RF signal provided by the attenuator 140 will be described with reference to FIG. 2.

Figure 2:
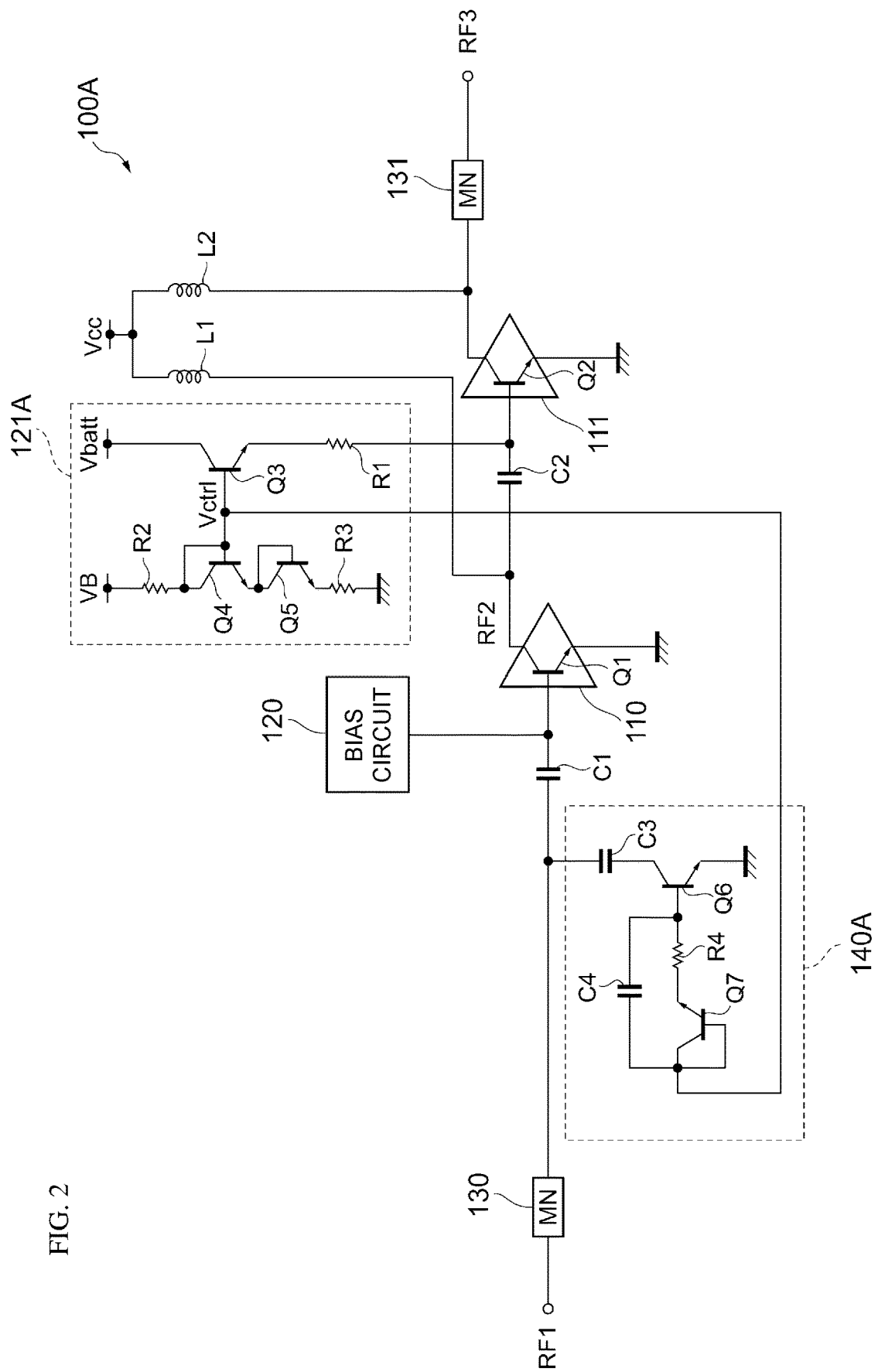
FIG. 2 illustrates an example of a configuration of the power amplifier circuit according to the first embodiment of the present disclosure.

FIG. 2 illustrates an example of a configuration of the power amplifier circuit according to the first embodiment of the present disclosure. In a power amplifier circuit 100A illustrated in FIG. 2, specific configurations of the bias circuit 121 and the attenuator 140 in particular of the power amplifier circuit 100 illustrated in FIG. 1 are illustrated.

The amplifiers 110 and 111 include respective transistors Q1 and Q2. With respect to the transistor Q1 (first transistor), a power-supply voltage Vcc is supplied to a collector via an inductor L1, the RF signal RF1 and a bias current or a bias voltage are supplied to a base, and an emitter is connected to the ground. Thus, the transistor Q1 outputs the RF signal RF2 obtained by amplifying the RF signal RF1 from the collector. With respect to the transistor Q2 (second transistor), the power-supply voltage Vcc is supplied to a collector via an inductor L2, the RF signal RF2 and a bias current or a bias voltage are supplied to a base, and an emitter is connected to the ground. Thus, the transistor Q2 outputs the RF signal RF3 obtained by amplifying the RF signal RF2 from the collector.

With respect to the inductors L1 and L2, the power-supply voltage Vcc is supplied to one ends, and the other ends are connected to the respective collectors of the transistors Q1 and Q2. Each of the inductors L1 and L2 is a choke inductor that inhibits an alternating-current component from leaking to a power-supply voltage Vcc side.

A bias circuit 121A includes, for example, transistors Q3 to Q5, and resistance elements R1 to R3. The configuration of the first-stage bias circuit 120 can be regarded as the same configuration as the subsequent-stage bias circuit 121A, and thus a detailed description thereof is omitted.

With respect to the transistor Q3 (fourth transistor), a battery voltage Vbatt is supplied to a collector, a base is connected to a base of the transistor Q4, and an emitter is connected to the base of the transistor Q2 via the resistance element R1.

With respect to the transistor Q4, a collector and the base are connected (hereinafter this type of connection is also referred to as "diode-connected"), a bias control voltage VB is supplied to the collector via the resistance element R2, and an emitter is connected to a collector of the transistor Q5. With respect to the transistor Q5, the transistor Q5 is diode-connected, the collector is connected to the emitter of the transistor Q4, and an emitter is connected to the ground via the resistance element R3. A diode-connected bipolar transistor acts as a bipolar element equivalent to a diode. As used herein, the terms "diode" and "diode element" interchangeably refer to either a diode or a diode-connected transistor. Of two terminals of the diode-connected bipolar transistor, during forward bias, one terminal that is high in potential corresponds to an anode, and the other terminal that is low in potential corresponds to a cathode. That is, the transistor Q4 and the transistor Q5 respectively constitute a second diode and a third diode. Thus, a certain level of voltage (for example, about 2.6 V) is generated at the collector of the transistor Q4. The second diode and the third diode may be constituted by diodes in place of the diode-connected transistors Q4 and Q5. In this case, the collector (or base) and the emitter are to be read as an anode and a cathode, respectively. The same holds true for a diode-connected transistor to be described.

With respect to the resistance element R1, one end is connected to the emitter of the transistor Q3, and the other end is connected to the base of the transistor Q2. The resistance element R1 suppresses an increase in bias current accompanying an increase in transistor temperature. With respect to the resistance element R2, the bias control voltage VB is supplied to one end, and the other end is connected to the collector of the transistor Q4. With respect to the resistance element R3, one end is connected to the emitter of the transistor Q5, and the other end is connected to the ground.

In the above-described configuration, the transistor Q3 supplies a bias current from the emitter to the base of the transistor Q2. The amount of the bias current is controlled by the bias control voltage VB or a bias control current supplied to the collector of the transistor Q4. Furthermore, the bias circuit 121A does not have to include the resistance elements R1 to R3.

An attenuator 140A includes transistors Q6 and Q7, a resistance element R4, and capacitors C3 and C4.

With respect to the transistor Q6 (third transistor), a collector is connected via the capacitor C3 to a supply path of the RF signal RF1 to the transistor Q1, a base is connected to an emitter of the transistor Q7 via the resistance element R4, and an emitter is connected to a ground side. In the present specification, "being connected to a supply path" is not limited to a form of being directly connected to a supply path and includes a form of being connected to a supply path via a component, such as another element. The operating state of the transistor Q6 is controlled in accordance with the control voltage Vctrl supplied from the bias circuit 121A to the base of the transistor Q6. Specifically, the transistor Q6 is turned on when the level of the control voltage Vctrl is high, and is turned off when the level of the control voltage Vctrl is low. When the transistor Q6 is on, the transistor Q6 allows a part of the RF signal RF1 to pass from the collector to the emitter to thereby attenuate the RF signal RF1 that passes through the supply path to the transistor Q1.

The capacitor C3 is connected between the supply path of the RF signal RF1 and the collector of the transistor Q6. The capacitor C3 inhibits a direct-current component at the collector of the transistor Q6 from being supplied to the supply path of the RF signal RF1.

The attenuator 140A may include a resistance element in place of the capacitor C3 or may include a resistance element connected in series with the capacitor C3. In the case where the attenuator 140A includes the resistance element, the RF signal RF1 is attenuated by a combination of a collector-emitter resistance value of the transistor Q6 and a resistance value of the resistance element. That is, a relationship between the control voltage Vctrl and an attenuation of the RF signal is adjusted by adjusting the resistance value of the resistance element, thereby making it possible to control the attenuation of the RF signal.

With respect to the transistor Q7, the transistor Q7 is diode-connected, the control voltage Vctrl is supplied to a collector, and the emitter is connected to the base of the transistor Q6 via the resistance element R4. The transistor Q7 constitutes a first diode. With respect to the resistance element R4, one end is connected to the emitter of the transistor Q7, and the other end is connected to the base of the transistor Q6. The transistor Q7 is provided to allow the value of the voltage to be supplied to the base of the transistor Q6 to match a drive level by reducing the control voltage Vctrl by a base-emitter voltage of the transistor Q7. Furthermore, the voltage to be supplied to the base of the transistor Q6 can be adjusted by adjusting a resistance value of the resistance element R4.

The capacitor C4 is connected in parallel with the transistor Q7 and the resistance element R4. Specifically, with respect to the capacitor C4, one end is connected to the collector of the transistor Q7, and the other end is connected to the base of the transistor Q6. For example, the capacitor C4 has a capacitance value larger than a collector-emitter capacitance value of the transistor Q7 and has the following function. That is, the amplitude of the RF signal RF2 to be supplied to the transistor Q2 varies at an envelope frequency (ranging from about several MHz to several tens of MHz), and thus the control voltage Vctrl also varies according to this variation. Hence, to improve the linearity of gain, an attenuation of the RF signal has to be varied according to a variation in the control voltage Vctrl. However, in the case where the current drive capability of the transistor Q7 is low, it may not be able to follow a change in voltage at an envelope frequency by using only the transistor Q7. In this regard, since the attenuator 140A includes the capacitor C4, a variation in the control voltage Vctrl is transmitted to the base of the transistor Q6 via the capacitor C4. Thus, in the attenuator 140A, follow-up performance where the attenuation follows a variation in the control voltage Vctrl is further improved.

Figure 3A:
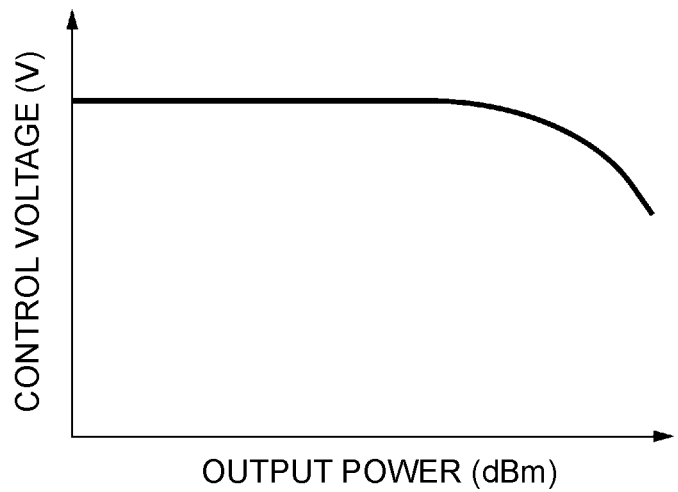
FIG. 3A illustrates a relationship between the output power of the power amplifier circuit and a control voltage Vctrl.
Figure 3B:
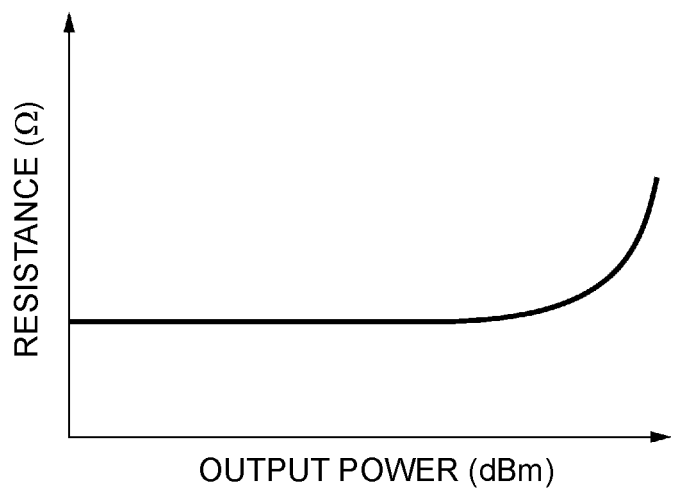
FIG. 3B illustrates a relationship between the output power of the power amplifier circuit and the collector-emitter resistance of a transistor.
Figure 3C:
FIG. 3C illustrates a relationship between the collector-emitter resistance of the transistor and an attenuation of an RF signal.
Figure 3D:
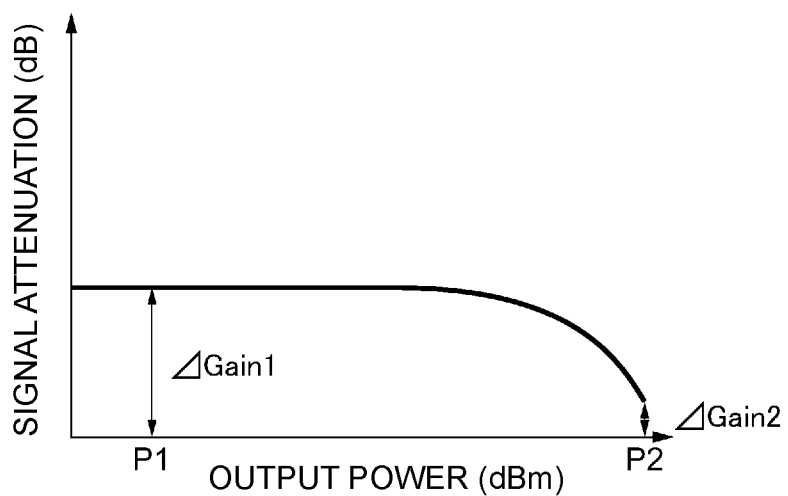
FIG. 3D illustrates a relationship between the output power of the power amplifier circuit and an attenuation of the RF signal.
Figure 3E:
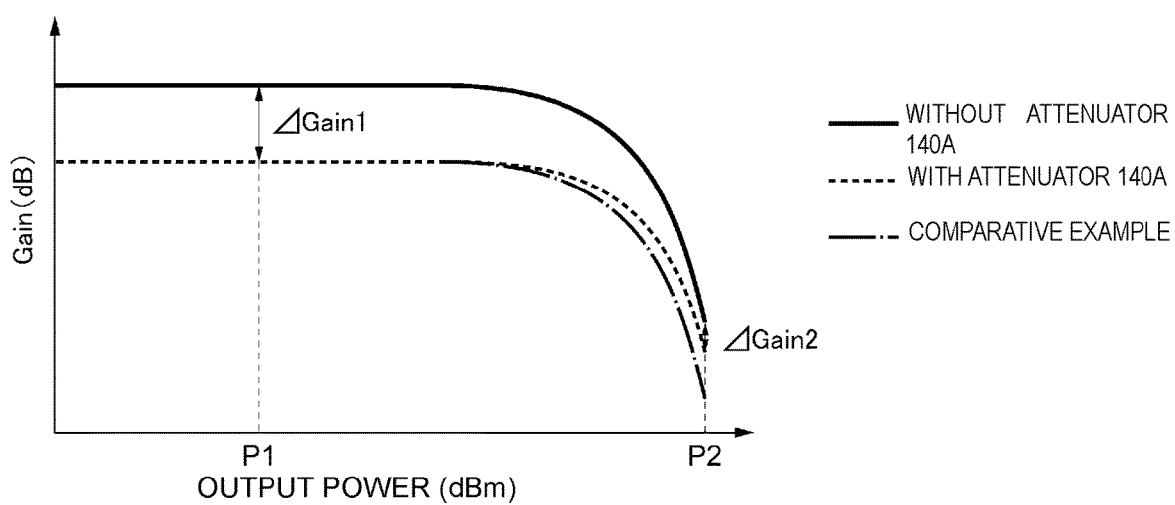
FIG. 3E illustrates a relationship between the output power and gain of the power amplifier circuit.

Next, the operating principles and effects of the power amplifier circuit 100A will be described with reference to FIGS. 3A to 3E. Here, FIG. 3A illustrates a relationship between the output power of the power amplifier circuit and the control voltage Vctrl. FIG. 3B illustrates a relationship between the output power of the power amplifier circuit and the collector-emitter resistance of the transistor Q6. FIG. 3C illustrates a relationship between the collector-emitter resistance of the transistor Q6 and an attenuation of the RF signal. FIG. 3D illustrates a relationship between the output power of the power amplifier circuit and an attenuation of the RF signal. FIG. 3E illustrates a relationship between the output power and gain of the power amplifier circuit.

In FIG. 3A, the horizontal axis represents the output power (dBm) of the power amplifier circuit, and the vertical axis represents control voltage Vctrl (V). The control voltage Vctrl (that is, a base voltage of the transistor Q3) varies according to a power level of the RF signal RF2 to be supplied to the transistor Q2. Specifically, when the power level of the RF signal RF2 increases (that is, when an output power level increases), the current amplitude at the collector of the transistor Q2 increases. Here, a collector current does not flow in a negative direction. For this reason, when the current amplitude at the collector of the transistor Q2 increases, a negative portion of the amplitude below an idle current value is cut off. At this time, an increase in the amplitude in a positive direction is not limited, and thus an average direct current of collector and base direct currents of the transistor Q2 increases. An emitter voltage of the transistor Q3 varies such that this increase in the average direct current is covered, and the collector and base direct currents of the transistor Q3 increase (self-bias effect). On the other hand, a base current of the transistor Q3 is supplied, via the resistance element R2, from a power supply that supplies the bias control voltage VB. Assuming that, when the base current of the transistor Q3 increases, the control voltage Vctrl increases, a current that flows to the collectors of the transistors Q4 and Q5 also increases, and a voltage drop at the resistance element R2 is supposed to increase, thus causing a contradiction. That is, when the base current of the transistor Q3 increases, the control voltage Vctrl decreases. Thus, as the power level of the RF signal RF2 increases, the control voltage Vctrl decreases (see FIG. 3A). Here, in a region (hereinafter also referred to as "low power region") in which the output power is relatively low, the control voltage Vctrl is maintained at a level at which the transistor Q6 is on. On the other hand, in a region (hereinafter also referred to as "high power region") in which the output power is above a certain level, the control voltage Vctrl gradually decreases, and thus a current that flows between the collector and emitter of the transistor Q6 also decreases. When the control voltage Vctrl decreases further, the transistor Q6 is turned off.

In FIG. 3B, the horizontal axis represents the output power (dBm) of the power amplifier circuit, and the vertical axis represents the collector-emitter resistance (Ω) of the transistor Q6. As described above, the transistor Q6 is on in the low power region, and thus the collector-emitter resistance of the transistor Q6 is maintained at an on-resistance value. On the other hand, in the high power region, the collector-emitter resistance of the transistor Q6 gradually increases as the control voltage Vctrl decreases. That is, as illustrated in FIG. 3B, the collector-emitter resistance of the transistor Q6 increases as the output power increases.

In FIG. 3C, the horizontal axis represents the collector-emitter resistance (Ω) of the transistor Q6, and the vertical axis represents attenuation (dB) of the RF signal. As illustrated in FIG. 3C, when the collector-emitter resistance of the transistor Q6 is low, the amount of the RF signal that flows from the supply path of the RF signal RF1 to the transistor Q6 via the capacitor C3 is large, and thus an attenuation of the RF signal RF1 is large. On the other hand, as the collector-emitter resistance of the transistor Q6 increases, the amount of the RF signal that flows to the transistor Q6 decreases, and thus an attenuation of the RF signal RF1 is small.

In FIG. 3D, the horizontal axis represents the output power (dBm) of the power amplifier circuit, and the vertical axis represents the attenuation (dB) of the RF signal. As described above, in the power amplifier circuit 100A, the transistor Q6 is on in the low power region, and an attenuation of the RF signal is large. On the other hand, as the output power increases, a resistance value of the transistor Q6 increases. Thus, the amount of the RF signal that flows to the transistor Q6 decreases, and an attenuation of the RF signal decreases continuously. For example, as illustrated in FIG. 3D, assuming that an attenuation at output power P1 is ΔGain1 and an attenuation at output power P2 (>P1) is ΔGain2, a relationship of ΔGain1>ΔGain2 is satisfied.

In FIG. 3E, the horizontal axis represents the output power (dBm) of the power amplifier circuit, and the vertical axis represents the gain (dB) of the power amplifier circuit. Furthermore, a solid line represents the gain in the case where the attenuator 140A is not included, a dashed line represents the gain in the case where the attenuator 140A is included, and a dashed-dotted line represents the gain in a configuration (comparative example) where an attenuator that provides a fixed attenuation is included. As illustrated in FIG. 3E, in the case where the attenuator 140A is not included, the gain starts to decrease when the output power exceeds a certain level, and the linearity deteriorates (see the solid line). On the other hand, in the power amplifier circuit 100A, in the low power region, the attenuator 140A reduces the gain by ΔGain1. As the output power level increases, an attenuation decreases, and a reduction in gain is suppressed by up to ΔGain2 at the output power P2. That is, in the power amplifier circuit 100A, the control is performed so that an attenuation is large in the low power region and is small in the high power region, thereby improving the linearity of gain in both the low power region and the high power region (see the dashed line). In the comparative example where a fixed attenuation is provided regardless of the output power, the gain is reduced even in the high power region (see the dashed-dotted line). In comparison with such a comparative example, the power amplifier circuit 100A enables a further improvement in linearity.

As just described, in the power amplifier circuit 100A, the base voltage of the transistor Q3 in the bias circuit 121A is used as a source of the control voltage Vctrl, and thus an attenuation of the RF signal can be changed continuously in accordance with the output power. Hence, in comparison with the configuration disclosed in U.S. Pat. No. 6,842,072, the linearity of the gain of the power amplifier circuit 100A can be improved with high accuracy.

In the power amplifier circuit 100A, a control signal to be supplied to the base of the transistor Q3 does not have to be generated as in the configuration disclosed in U.S. Pat. No. 6,842,072, and thus a circuit configuration can be simplified.

Furthermore, the attenuator 140A includes the capacitor C4, thereby making it possible to improve follow-up performance where the attenuation follows a variation in the control voltage Vctrl even when an envelope frequency of the RF signal is high. Hence, this also improves the linearity of the gain of the power amplifier circuit 100A.

Figure 4:
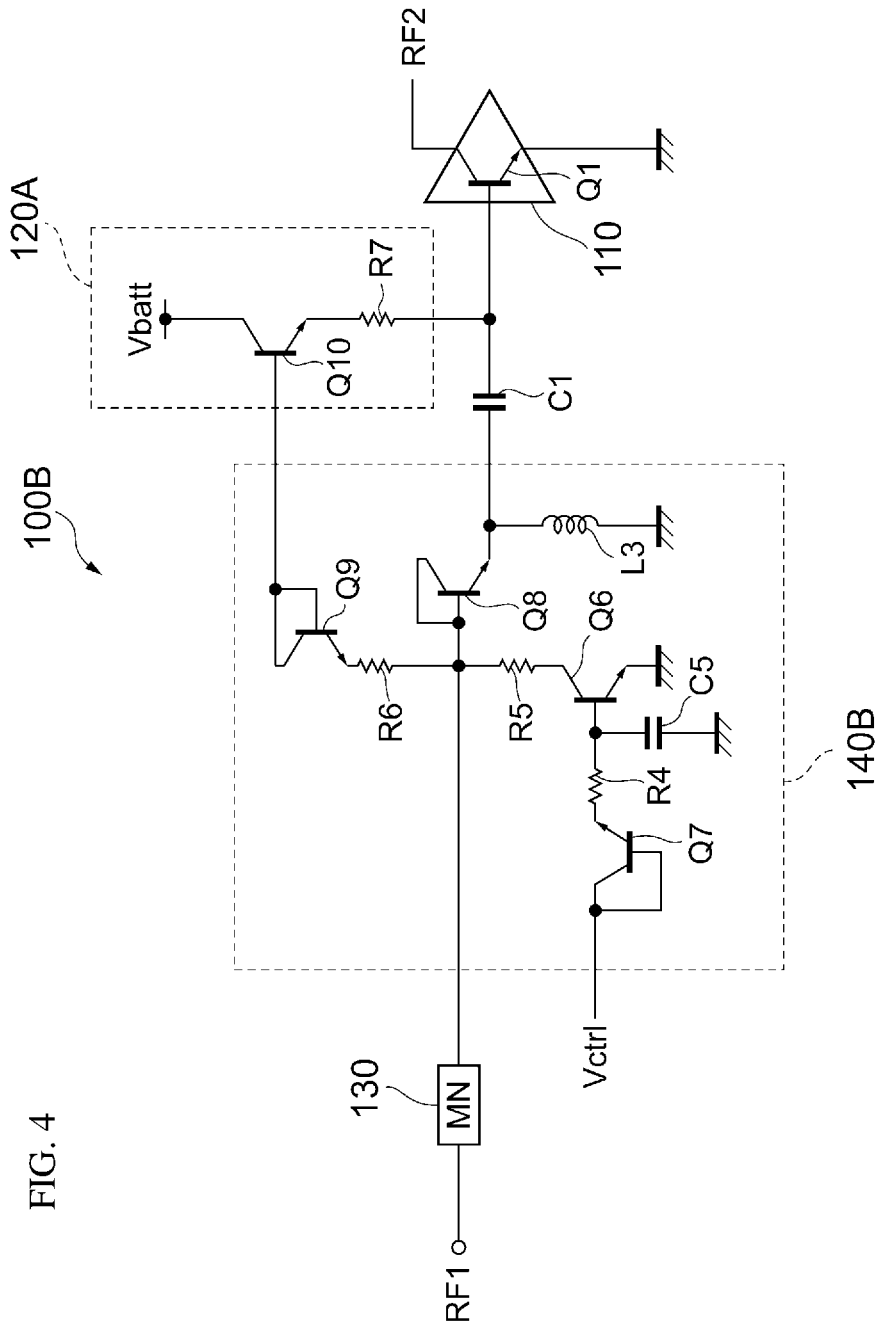
FIG. 4 illustrates an example of a configuration of a power amplifier circuit according to a second embodiment of the present disclosure.
Figure 5:
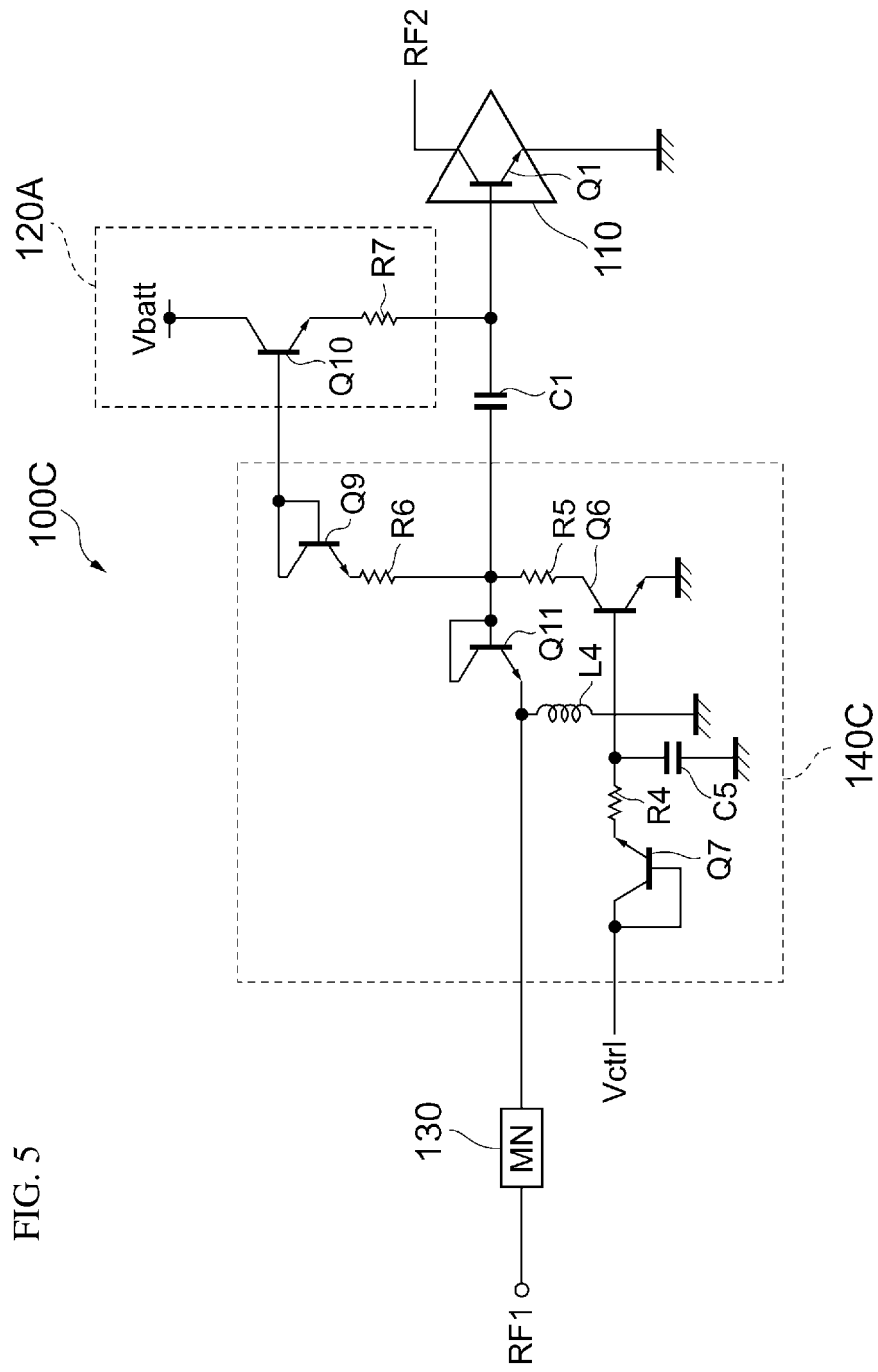
FIG. 5 illustrates an example of another configuration of the power amplifier circuit according to the second embodiment of the present disclosure.

FIG. 4 illustrates an example of a configuration of a power amplifier circuit according to a second embodiment of the present disclosure. FIG. 5 illustrates an example of another configuration of the power amplifier circuit according to the second embodiment of the present disclosure. In second and subsequent embodiments, descriptions of things in common with the first embodiment are omitted, and only points in which the second and subsequent embodiments differ from the first embodiment will be described. In particular, similar operation and effects based on similar configurations are not repeatedly described for each embodiment. In FIGS. 4 and 5, among elements included in power amplifier circuits 100B and 100C, only an element involved in a first stage is illustrated, and an illustration of an element involved in a subsequent stage is omitted.

In the power amplifier circuit 100B illustrated in FIG. 4, specific configurations of the bias circuit 120 and the attenuator 140 of the power amplifier circuit 100 illustrated in FIG. 1 are illustrated.

In comparison with the attenuator 140A illustrated in FIG. 2, an attenuator 140B further includes transistors Q8 and Q9, resistance elements R5 and R6, and an inductor L3, and includes a capacitor C5 in place of the capacitor C3.

The transistor Q8 is diode-connected and is connected in series with the supply path of the RF signal RF1 to the transistor Q1 to constitute a fourth diode. Specifically, with respect to the transistor Q8, the RF signal RF1 is supplied to a base via the matching network 130, and an emitter is connected to the base of the transistor Q1 via the capacitor C1. Furthermore, the base of the transistor Q8 is connected to the collector of the transistor Q6 via the resistance element R5, and the emitter of the transistor Q8 is connected to the ground via the inductor L3.

With respect to the transistor Q9, the transistor Q9 is diode-connected, a collector is connected to a base of a transistor Q10, and an emitter is connected to the collector of the transistor Q6 via the resistance elements R6 and R5.

With respect to the resistance element R5, one end is connected to the base of the transistor Q8, and the other end is connected to the collector of the transistor Q6. With respect to the resistance element R6, one end is connected to the emitter of the transistor Q9, and the other end is connected to the one end of the resistance element R5. The resistance elements R5 and R6 are provided to adjust a voltage level so that the transistors Q6, Q9, and Q10 appropriately operate.

With respect to the inductor L3, one end is connected to the emitter of the transistor Q8, and the other end is connected to the ground. The inductor L3 has a function of passing a direct-current component at the emitter of the transistor Q8 to the ground.

The capacitor C5 is a decoupling capacitor for letting a high frequency component included in the control voltage Vctrl supplied to the base of the transistor Q6 pass to the ground.

A bias circuit 120A includes the transistor Q10 and a resistance element R7. With respect to the transistor Q10, a collector voltage of the transistor Q9 is supplied to the base, and the transistor Q10 has the same function as the transistor Q3 illustrated in FIG. 2. The resistance element R7 has the same function as the resistance element R1 illustrated in FIG. 2.

In the power amplifier circuit 100B, the collector-emitter resistance of the transistor Q6 increases in the high power region as in the above-described power amplifier circuit 100A. Thus, a base voltage of the transistor Q8 increases, and the collector-emitter resistance of the transistor Q8 decreases. Hence, an attenuation of the RF signal in the supply path of the RF signal RF1 is small. Thus, in the power amplifier circuit 100B, the amount of change in the attenuation of the RF signal with respect to the amount of increase in the output power is larger than that in the power amplifier circuit 100A. Hence, for example, in the case where the degree of reduction in the gain accompanying an increase in the output power is steeper, the power amplifier circuit 100B is used, thereby making it possible to further improve the accuracy of the linearity of gain in comparison with the power amplifier circuit 100A.

In comparison with the power amplifier circuit 100B illustrated in FIG. 4, the power amplifier circuit 100C illustrated in FIG. 5 includes an attenuator 140C in place of the attenuator 140B.

In comparison with the attenuator 140B, the attenuator 140C includes a transistor Q11 in place of the transistor Q8 and includes an inductor L4 in place of the inductor L3.

The transistor Q11 is diode-connected and is connected in series with the supply path of the RF signal RF1 in the inverted orientation of the transistor Q8 to constitute the fourth diode. Specifically, with respect to the transistor Q11, the RF signal RF1 is supplied to an emitter via the matching network 130, and a base is connected to the base of the transistor Q1 via the capacitor C1. In the transistor Q11, the collector-emitter resistance decreases as the output power increases as in the transistor Q8. Thus, an attenuation of the RF signal decreases as the output power increases. Hence, even such a configuration makes it possible to further improve the linearity of gain as in the power amplifier circuit 100B.

The attenuators 140B and 140C may include the capacitor C4 connected in parallel with the transistor Q7 as in the attenuator 140A. Furthermore, the attenuators 140B and 140C do not have to include the capacitor C5.

Figure 6:
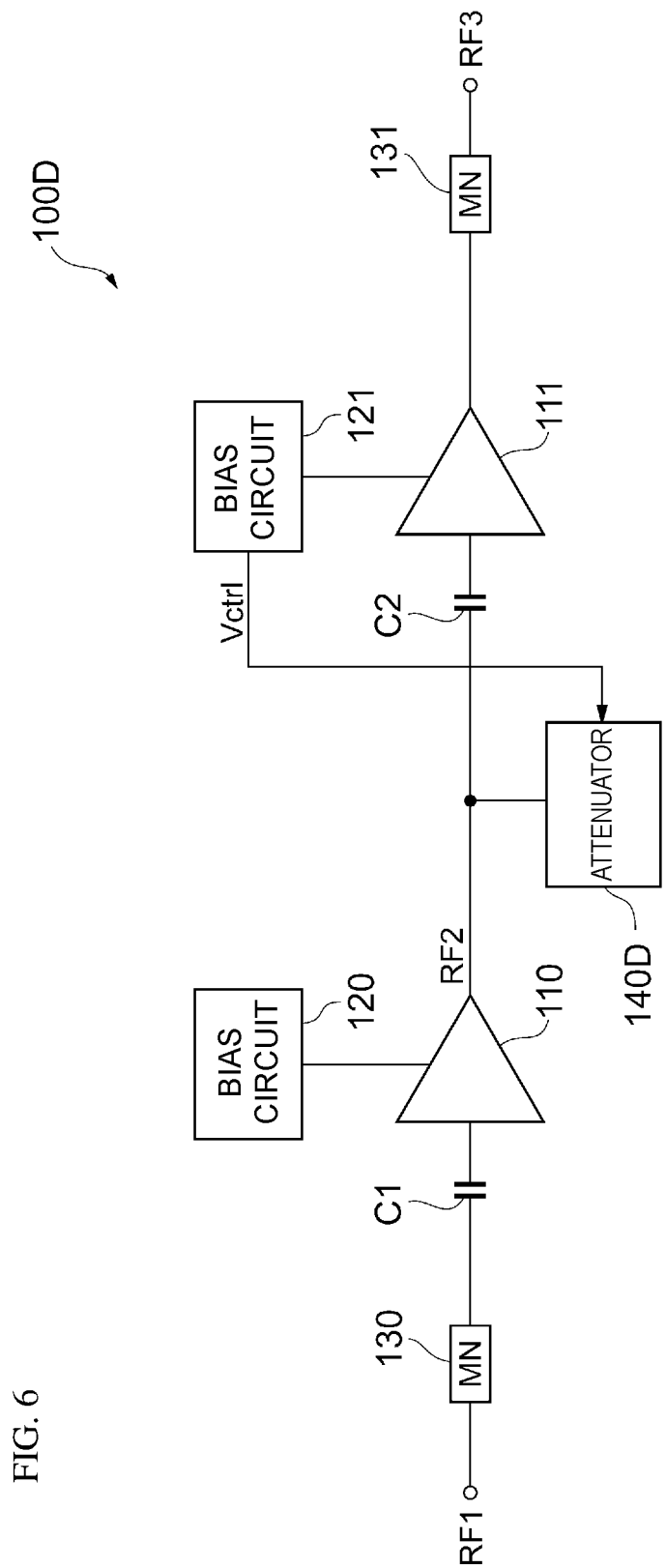
FIG. 6 illustrates an overview of a configuration of a power amplifier circuit according to a third embodiment of the present disclosure.
Figure 7:
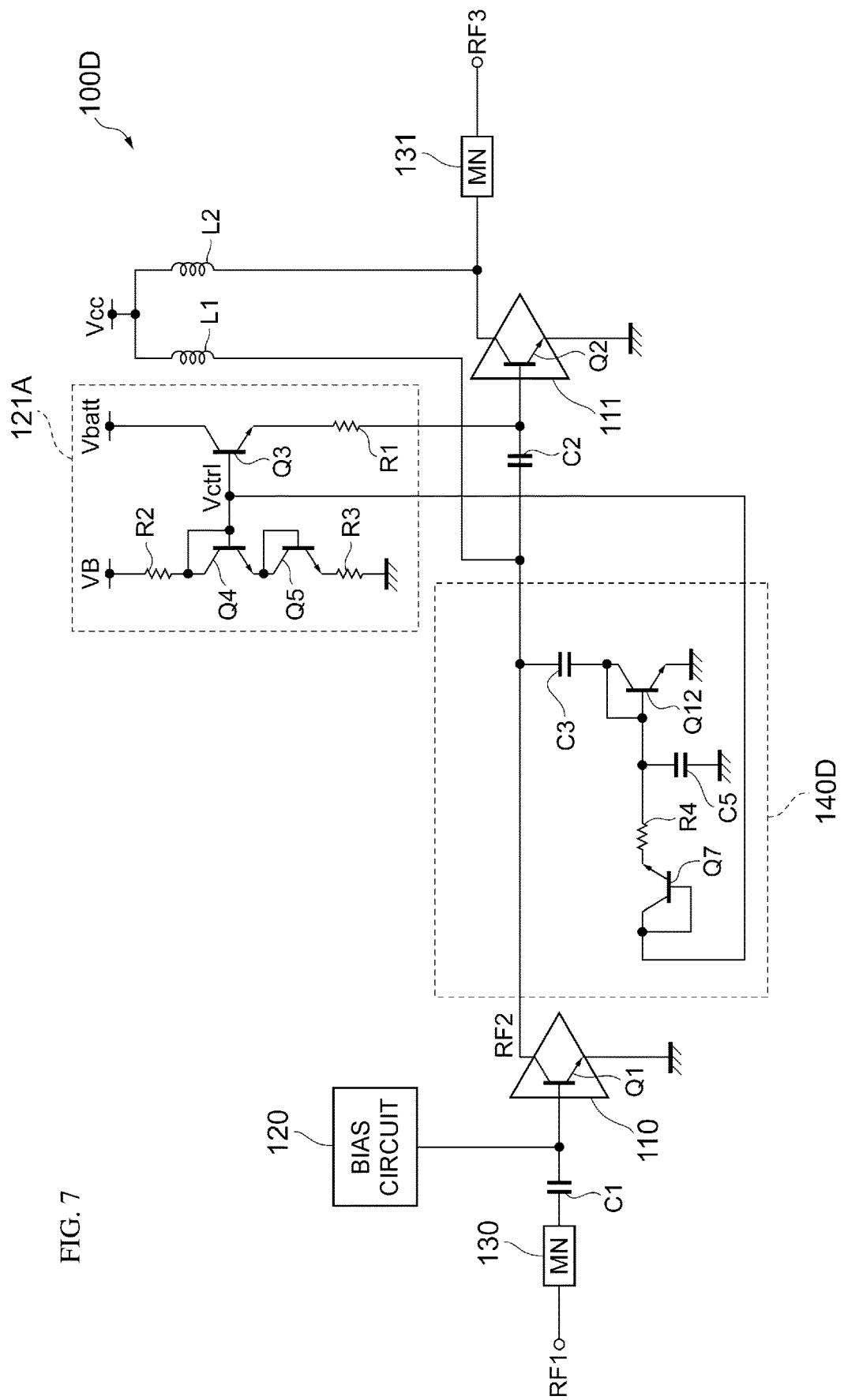
FIG. 7 illustrates an example of a configuration of the power amplifier circuit according to the third embodiment of the present disclosure.

FIG. 6 illustrates an overview of a configuration of a power amplifier circuit according to a third embodiment of the present disclosure. FIG. 7 illustrates an example of a configuration of the power amplifier circuit according to the third embodiment of the present disclosure. In comparison with the power amplifier circuit 100 illustrated in FIG. 1, a power amplifier circuit 100D illustrated in FIGS. 6 and 7 includes an attenuator 140D in place of the attenuator 140. The attenuator 140D is provided at an input of the subsequent-stage amplifier 111 and attenuates the RF signal RF2 to be supplied to the subsequent-stage amplifier 111.

In comparison with the attenuator 140A, the attenuator 140D includes a transistor Q12 in place of the transistor Q6 and further includes the capacitor C5.

In the transistor Q12 (third transistor), a connection similar to that in the transistor Q6 is established except that the transistor Q12 is diode-connected.

In the attenuator 140D, when the RF signal RF2 is supplied to a collector of the transistor Q12 via the capacitor C3, a collector voltage of the transistor Q12 vibrates, and a base voltage connected to the collector also vibrates. When a power level of the RF signal RF2 increases, a state occurs in which the transistor Q12 is off, thus causing a change in the collector-emitter resistance of the transistor Q12. The transistor Q7 is repeatedly turned on and off alternately with on and off switching of the transistor Q12. Thus, in comparison with a configuration in which the transistor Q12 is not diode-connected, the electric charge is drawn from the base of the transistor Q3, and the control voltage Vctrl therefore decreases more as the output power increases.

Figure 8A:
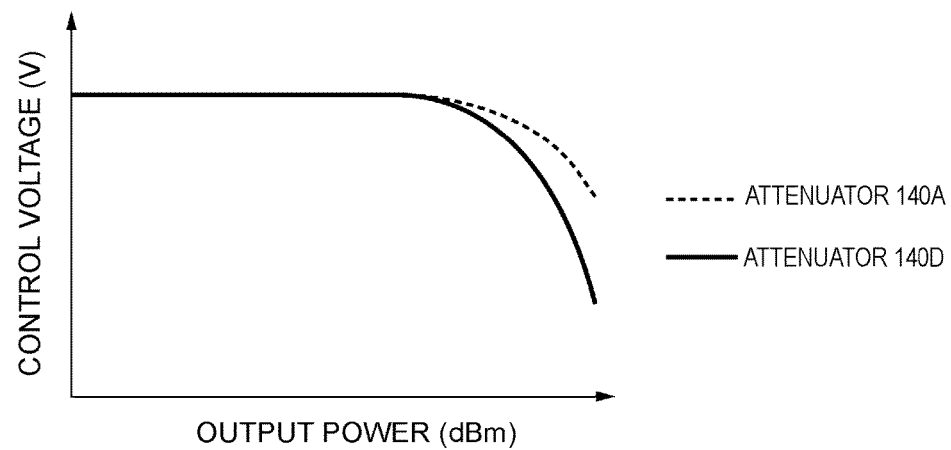
FIG. 8A illustrates a relationship between the output power of the power amplifier circuit and the control voltage Vctrl.
Figure 8B:
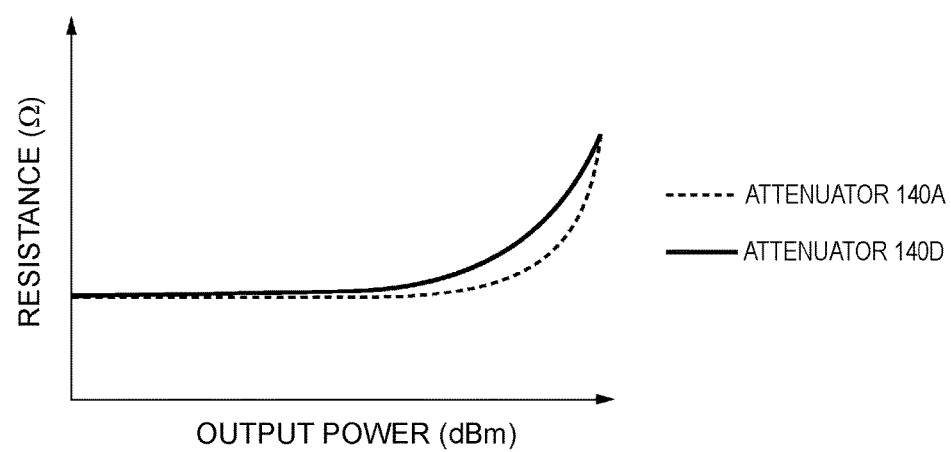
FIG. 8B illustrates a relationship between the output power of the power amplifier circuit and collector-emitter resistance of a transistor.
Figure 8C:
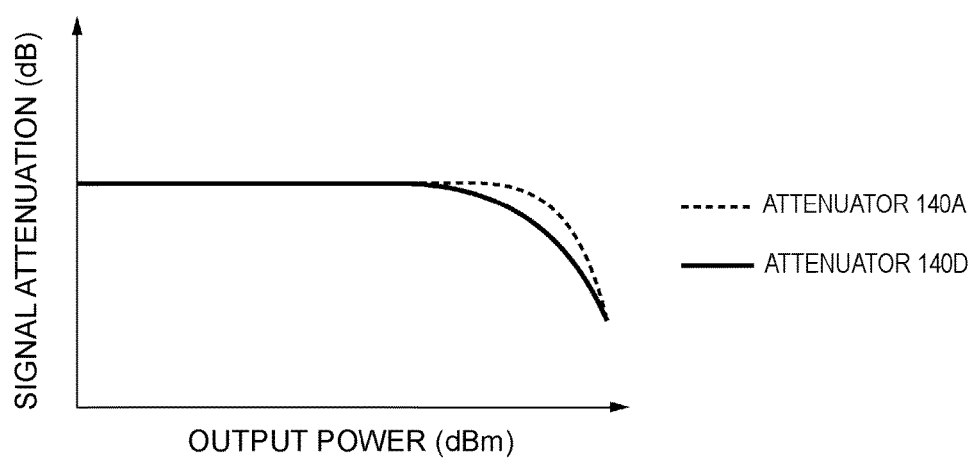
FIG. 8C illustrates a relationship between the output power of the power amplifier circuit and an attenuation of the RF signal.

FIG. 8A illustrates a relationship between the output power of the power amplifier circuit and the control voltage Vctrl. FIG. 8B illustrates a relationship between the output power of the power amplifier circuit and collector-emitter resistance of the transistor Q12. FIG. 8C illustrates a relationship between the output power of the power amplifier circuit and an attenuation of the RF signal. Furthermore, in FIGS. 8A to 8C, a solid line represents the attenuator 140D, and a dashed line represents the attenuator 140A.

As illustrated in FIG. 8A, in the attenuator 140D, the degree of decrease in the control voltage Vctrl accompanying an increase in the output power is large in comparison with the attenuator 140A. Furthermore, as described above, the base voltage of the transistor Q12 vibrates, thereby causing a change in the collector-emitter resistance of the transistor Q12. Due to these effects, as illustrated in FIG. 8B, in the attenuator 140D, a curve representing an increase in the collector-emitter resistance of the transistor Q12 accompanying an increase in the output power is gentle in comparison with the attenuator 140A. Thus, as illustrated in FIG. 8C, in the attenuator 140D, the amount of change in attenuation provided by the attenuator 140D accompanying an increase in the output power is gentle in comparison with the attenuator 140A. Hence, for example, in the case where the level of reduction in the gain accompanying an increase in the output power is gentle, the configuration of the attenuator 140D is used, thereby making it possible to improve the linearity of gain. As just described, as the configuration of the attenuator 140, various configurations can be used according to the level of reduction in the gain.

The attenuator 140D may include the capacitor C4 as in the attenuator 140A.

Although FIGS. 6 and 7 illustrate the example where the attenuator 140D is provided at the input of the subsequent-stage amplifier 111, a configuration in which the attenuator 140D is provided at an input of the first-stage amplifier 110 is not intended to be excluded. In the configuration in which the attenuator 140D is provided at the input of the subsequent-stage amplifier 111, a voltage amplitude at the collector of the transistor Q12 is large in comparison with the configuration in which the attenuator 140D is provided at the input of the first-stage amplifier 110, and thus the configuration in which the transistor Q12 is diode-connected is remarkably effective.

Figure 9:
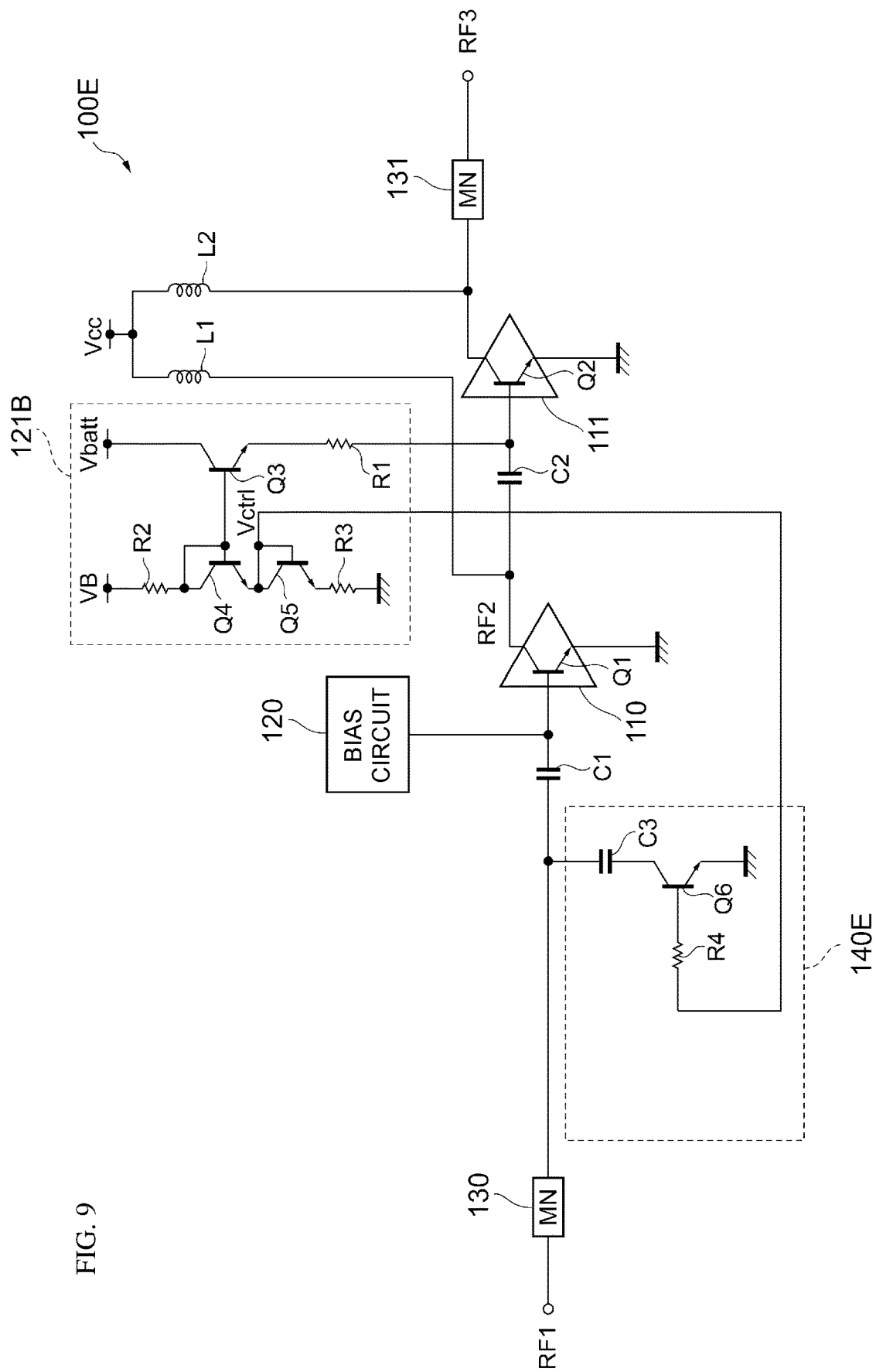
FIG. 9 illustrates an example of a configuration of a power amplifier circuit according to a fourth embodiment of the present disclosure.

FIG. 9 illustrates an example of a configuration of a power amplifier circuit according to a fourth embodiment of the present disclosure. In comparison with the power amplifier circuit 100A, a power amplifier circuit 100E illustrated in FIG. 9 includes a bias circuit 121B in place of the bias circuit 121A and includes an attenuator 140E in place of the attenuator 140A.

Although the bias circuit 121B includes the same components as the bias circuit 121A, the bias circuit 121B differs from the bias circuit 121A in that, as the control voltage Vctrl, a collector voltage of the transistor Q5 (that is, an anode voltage of the transistor Q5) is outputted in place of the base voltage of the transistor Q3. The collector voltage of the transistor Q5 is a value obtained by subtracting a base-emitter voltage of the transistor Q4 from the base voltage of the transistor Q3.

In comparison with the attenuator 140A, the attenuator 140E does not include the transistor Q7 and the capacitor C4. That is, in the power amplifier circuit 100E, the control voltage Vctrl is lower than that in the power amplifier circuit 100A by a collector-emitter voltage of the transistor Q4, and thus the transistor Q7 does not have to be provided. Furthermore, in the power amplifier circuit 100E, the control voltage Vctrl is supplied to the base of the transistor Q6 without passing through the transistor Q7, and thus the capacitor C4 does not have to be provided.

As in the base voltage of the transistor Q3 illustrated in FIG. 3A, the control voltage Vctrl in this embodiment changes as the output power increases. Hence, the power amplifier circuit 100E having such a configuration can also achieve the same effect as the power amplifier circuit 100A.

Furthermore, in the power amplifier circuit 100E, in the case where the current drive capability of the transistor Q5 is higher than that of the transistor Q7, the operating speed of the attenuator 140E is faster than that in the power amplifier circuit 100A. Hence, it is possible to improve follow-up performance where the attenuation follows a variation in the amplitude of the RF signal RF1 without using the capacitor C4.

Incidentally, the source of the control voltage Vctrl is not limited to the base voltage of the transistor Q3 or the collector voltage of the transistor Q5 as described above. For example, the source of the control voltage Vctrl may be the emitter voltage of the transistor Q3.

The examples where an attenuation of the RF signal is adjusted by the attenuators 140A to 140E have been described above. Furthermore, in the power amplifier circuit 100, when the attenuators 140A to 140E are used after the gain is increased in the entire region including the low power region and the high power region, it is expected that the linearity of gain is further improved. A description of this will be presented with reference to FIG. 10.

Figure 10:
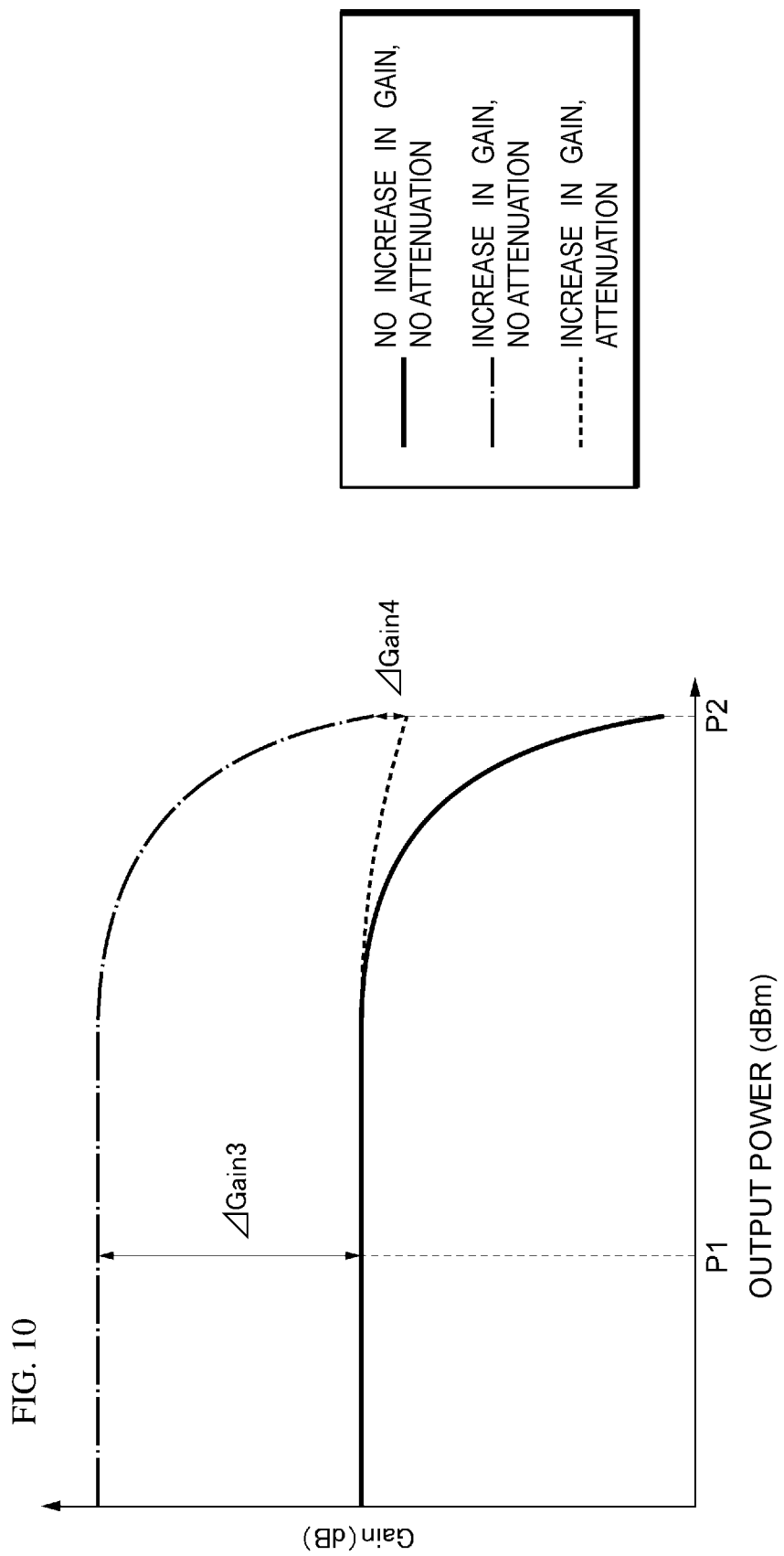
FIG. 10 illustrates a relationship between the output power and gain in the case where the overall gain of the power amplifier circuit is increased.

FIG. 10 illustrates a relationship between the output power and gain in the case where the overall gain of the power amplifier circuit is increased. In FIG. 10, the horizontal axis represents the output power (dBm), and the vertical axis represents the gain (dB). Furthermore, a solid line represents the case where the overall gain is not increased and no attenuator is included, a dashed-dotted line represents the case where the overall gain is increased and no attenuator is included, and a dashed line represents the case where the overall gain is increased and the RF signal is attenuated by an attenuator.

First, as illustrated in FIG. 10, assume that the overall gain of the power amplifier circuit 100 can be increased (see the dashed-dotted line in FIG. 10). Furthermore, assume that the attenuator 140 is configured so that, for example, an attenuation at the output power P1 is ΔGain3 (>ΔGain1) and an attenuation at the output power P2 is ΔGain4 (<ΔGain2) in comparison with attenuations illustrated in FIG. 3E. At this time, the amount of change in attenuation (ΔGain3-ΔGain4) is larger than the amount of change in attenuation (ΔGain1-ΔGain2) illustrated in FIG. 3E. As just described, the overall gain is increased, and then the attenuator that is larger in the amount of change in attenuation is used to attenuate the RF signal, thereby making it possible to improve the linearity of gain with higher accuracy (see the dashed line in FIG. 10).

Although a method of increasing the overall gain of the power amplifier circuit 100 is not limited to a particular method, examples of the method include the following three methods. A first method is a method in which a semiconductor chip on which the power amplifier circuit 100 is formed is made to have a flip-chip structure in place of a wire-bonding structure. Thus, the emitters of the transistors Q1 and Q2 are connected to the ground through a bump in place of a via, and the parasitic inductance occurring between each emitter and the ground can be reduced by about half. Hence, when the flip-chip structure is used in the semiconductor chip, the gain of the power amplifier circuit 100 can be increased by about 2 dB.

A second method is a method in which the number of amplifier stages included in the power amplifier circuit 100 is increased. For example, a configuration in which three stages of amplifiers are included makes it possible to increase the gain of the power amplifier circuit 100 by about 3 dB or more in comparison with a configuration in which two stages of amplifiers are included.

At the same time, when the power amplifier circuit 100 includes, for example, three stages of amplifiers, an attenuator may be provided at inputs of first-stage and second-stage amplifiers. This makes it possible to increase the amount of change in attenuation accompanying an increase in the output power in comparison with a configuration in which one attenuator is provided. Hence, as illustrated in FIG. 10, the linearity of gain can be improved with higher accuracy. An attenuator may be provided at inputs of all stages of amplifiers. Furthermore, as a specific configuration of the attenuator, any of the configurations of the above-described attenuators 140A to 140E or a combination of them may be used.

A third method is a method in which at least one of the transistors Q1 and Q2 included in the power amplifier circuit 100 is constituted by a FET in place of an HBT. This makes it possible to increase the gain of the power amplifier circuit 100 by about 2 dB in comparison with an HBT. A transistor or transistors replaced by a FET or FETs may be only a first-stage transistor, only a subsequent-stage transistor, or both of the first-stage and subsequent-stage transistors.

Figure 11:
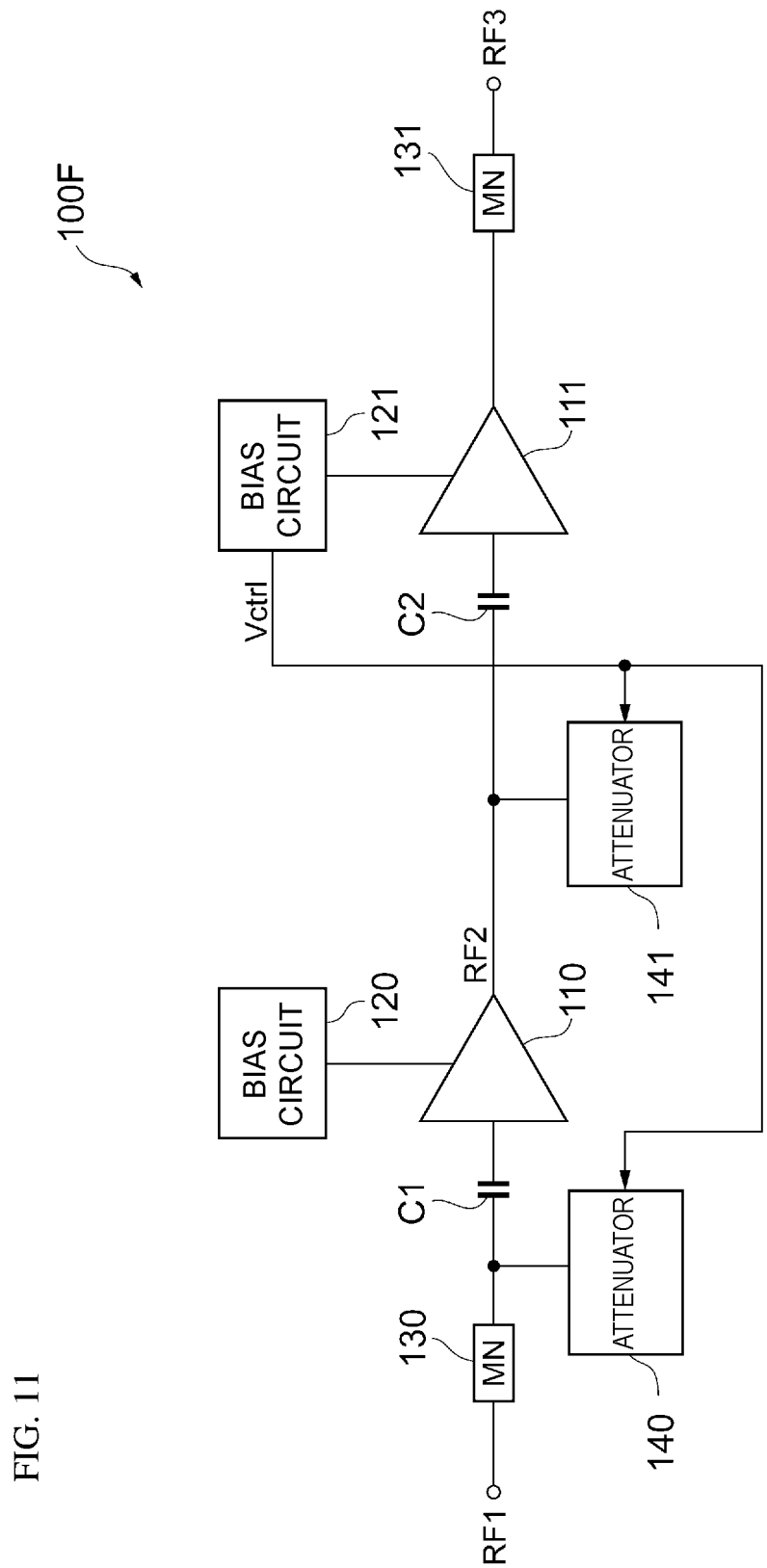
FIG. 11 illustrates an overview of a configuration of a power amplifier circuit according to a fifth embodiment of the present disclosure.

FIG. 11 illustrates an overview of a configuration of a power amplifier circuit according to a fifth embodiment of the present disclosure. In comparison with the power amplifier circuit 100 illustrated in FIG. 1, as illustrated in FIG. 11, a power amplifier circuit 100F further includes an attenuator 141. The attenuator 141 is provided at the input of the subsequent-stage amplifier 111. Thus, attenuators may be provided at respective inputs of both of the first-stage and subsequent-stage amplifiers. Furthermore, as a specific configuration of the attenuator 141, for example, any of the configurations of the above-described attenuators 140A to 140E can be used, and thus a detailed description is omitted.

Figure 12:
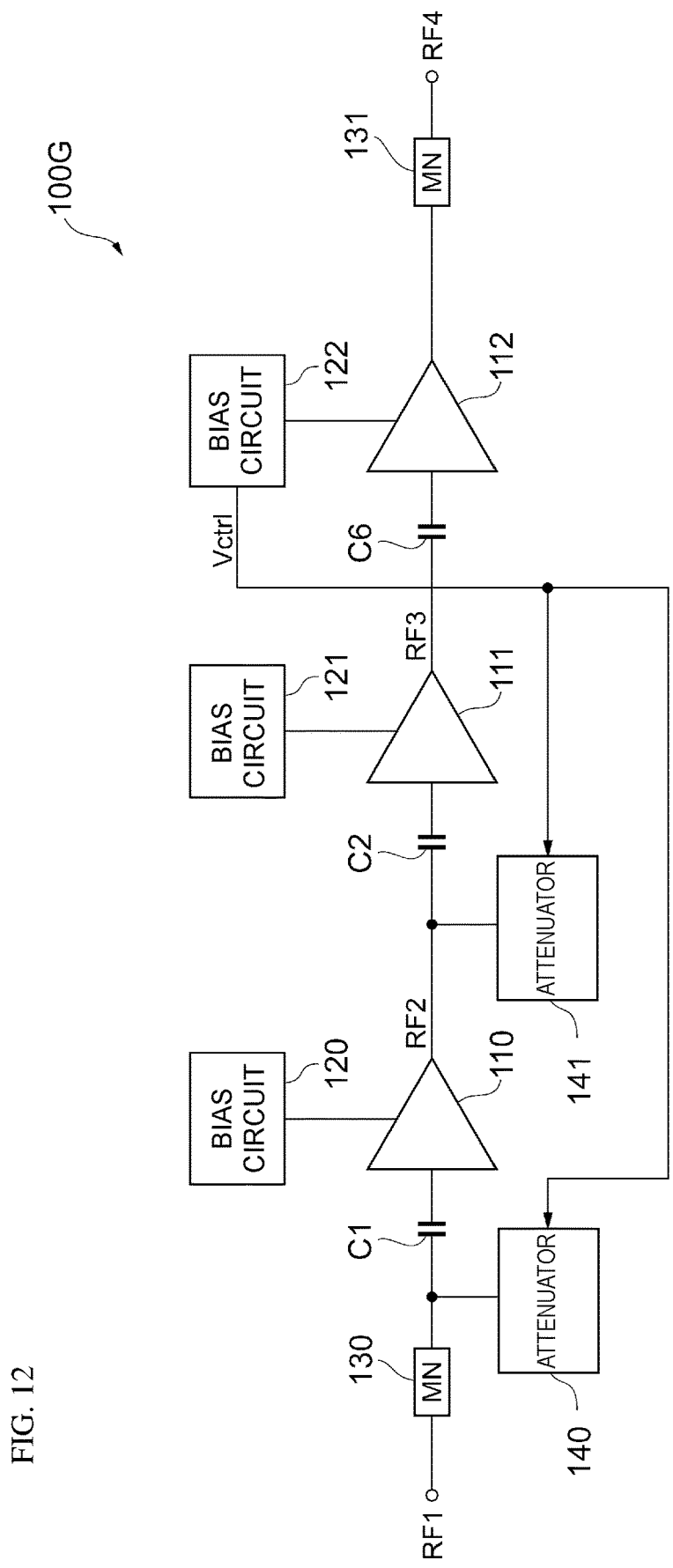
FIG. 12 illustrates an overview of a configuration of a power amplifier circuit according to a sixth embodiment of the present disclosure.

FIG. 12 illustrates an overview of a configuration of a power amplifier circuit according to a sixth embodiment of the present disclosure. As illustrated in FIG. 12, a power amplifier circuit 100G includes three stages of amplifiers and amplifies power through three stages. Specifically, in comparison with the power amplifier circuit 100F, the power amplifier circuit 100G further includes a third-stage amplifier 112, a bias circuit 122, and a capacitor C6.

The third-stage amplifier 112 amplifies the RF signal RF3 supplied from the second-stage amplifier 111 and outputs an RF signal RF4. In this embodiment, the attenuators 140 and 141 are provided at the respective inputs of the first-stage amplifier 110 and the second-stage amplifier 111. The configurations of the bias circuit 122 and the capacitor C6 correspond to the respective configurations of the bias circuit 121 and the capacitor C2, and thus detailed descriptions thereof are omitted.

Thus, even in the case where the power amplifier circuit 100G includes three stages of amplifiers, the same effect as that in each embodiment described above can be achieved. An attenuator may be provided at an input of only a first-stage amplifier or may be provided at inputs of all of first-stage to third-stage amplifiers. Even in these cases, it is preferable that the control voltage Vctrl is supplied from a bias circuit connected to a final-stage amplifier.

The exemplary embodiments of the present disclosure have been described above. The power amplifier circuit 100A includes the transistor Q1 configured to amplify the RF signal RF1; the transistor Q2 configured to amplify the RF signal RF2 corresponding to an output signal of the transistor Q1; the bias circuit 121A configured to supply a bias current or a bias voltage to a base or a gate of the transistor Q2; and the attenuator 140A configured to attenuate the RF signal RF1 in accordance with the control voltage Vctrl supplied from the bias circuit 121A. The attenuator 140A includes the first diode including an anode to which the control voltage Vctrl is supplied, the transistor Q6 including a collector connected to a supply path of the RF signal RF1 to the transistor Q1, an emitter connected to a ground side, and a base to which the control voltage Vctrl is supplied from a cathode of the first diode, and the capacitor C4 connected in parallel with the first diode. The control voltage Vctrl is a voltage that decreases as a power level of the RF signal RF2 increases. The transistor Q6 allows a part of the RF signal RF1 to pass from the collector to the emitter of the transistor Q6 in accordance with the control voltage Vctrl supplied to the base of the transistor Q6. This enables an attenuation of the RF signal to be changed continuously in accordance with the output power, and thus the linearity of the gain of the power amplifier circuit 100A can be improved with high accuracy in comparison with the configuration disclosed in U.S. Pat. No. 6,842,072. Furthermore, the power amplifier circuit 100A includes the capacitor C4, thereby making it possible to improve follow-up performance where the attenuation follows a variation in the control voltage Vctrl even when an envelope frequency of the RF signal is high.

Furthermore, the power amplifier circuit 100D includes the transistor Q1 configured to amplify the RF signal RF1; the transistor Q2 configured to amplify the RF signal RF2 corresponding to an output signal of the transistor Q1; the bias circuit 121A configured to supply a bias current or a bias voltage to a base or a gate of the transistor Q2; and the attenuator 140D configured to attenuate the RF signal RF2 in accordance with the control voltage Vctrl supplied from the bias circuit 121A. The attenuator 140D includes the first diode including an anode to which the control voltage Vctrl is supplied, and the transistor Q12 including a collector connected to a base and connected to a supply path of the RF signal RF2 to the transistor Q2, an emitter connected to a ground side, and the base to which the control voltage Vctrl is supplied from a cathode of the first diode. The control voltage Vctrl is a voltage that decreases as a power level of the RF signal RF2 increases. The transistor Q12 allows a part of the RF signal RF2 to pass from the collector to the emitter of the transistor Q12 in accordance with the control voltage Vctrl supplied to the base of the transistor Q12. Thus, in the power amplifier circuit 100D, the degree of decrease in the control voltage Vctrl accompanying an increase in the output power is large in comparison with the power amplifier circuit 100A, and the amount of change in attenuation provided by the attenuator 140D accompanying an increase in the output power is therefore gentle. Hence, for example, in the case where the level of reduction in the gain accompanying an increase in the output power is gentle, the linearity of gain can be improved.

Furthermore, in the power amplifier circuits 100A to 100D, the bias circuit 121A includes the transistor Q3 including a base to which a certain level of voltage is supplied and an emitter from which the bias current or the bias voltage is outputted, and outputs a base voltage of the transistor Q3 as the control voltage Vctrl. Thus, as the power level of the RF signal RF2 increases, the control voltage Vctrl decreases.

Furthermore, the power amplifier circuit 100E includes the transistor Q1 configured to amplify the RF signal RF1; the transistor Q2 configured to amplify the RF signal RF2 corresponding to an output signal of the transistor Q1; the bias circuit 121B configured to supply a bias current or a bias voltage to a base or a gate of the transistor Q2; and the attenuator 140E configured to attenuate the RF signal RF1 in accordance with the control voltage Vctrl supplied from the bias circuit 121B. The attenuator 140E includes the transistor Q6 including a collector connected to a supply path of the RF signal RF1 to the transistor Q1 and an emitter connected to a ground side. The bias circuit 121B includes the second diode and the third diode connected in series in which the bias control voltage VB is supplied to an anode of the second diode and a cathode of the third diode is connected to a ground side, and the transistor Q3 including a base connected to the anode of the second diode and an emitter from which the bias current or the bias voltage is outputted. The transistor Q6 allows a part of the RF signal RF1 to pass from the collector to the emitter of the transistor Q6 in accordance with the control voltage Vctrl supplied from an anode of the third diode to a base of the transistor Q6. Thus, the operating speed of the attenuator 140E is faster than that in the power amplifier circuit 100A, and it is therefore possible to improve follow-up performance where the attenuation follows a variation in the amplitude of the RF signal RF1 without using the capacitor C4.

Furthermore, in the power amplifier circuits 100B and 100C, the attenuators 140B and 140C include the fourth diode connected in series with a supply path on a side on which the transistor Q6 is provided, and the respective inductors L3 and L4 connected between a cathode of the fourth diode and the ground. Thus, in the power amplifier circuits 100B and 100C, the amount of change in attenuation of the RF signal with respect to the amount of increase in the output power is larger than that in the power amplifier circuit 100A. Hence, for example, in the case where the degree of reduction in the gain accompanying an increase in the output power is steeper, the accuracy of the linearity of gain can be improved.

Furthermore, in the power amplifier circuits 100A to 100E, an emitter or a source of the transistor Q1 and an emitter or a source of the transistor Q2 may each be connected to the ground through a bump. Thus, the parasitic inductance occurring between each emitter and the ground can be reduced. Hence, since the overall gain of the power amplifier circuit is increased, an attenuator that is larger in the amount of change in attenuation is used, thereby making it possible to improve the linearity of gain with higher accuracy.

Furthermore, in the power amplifier circuits 100A to 100E, at least one of the transistors Q1 and Q2 may be constituted by a FET. This also increases the gain of the power amplifier circuit, and thus an attenuator that is larger in the amount of change in attenuation is used, thereby making it possible to improve the linearity of gain with higher accuracy.

The above-described embodiments are intended to facilitate understanding of the present disclosure, but are not intended for a limited interpretation of the present disclosure. The present disclosure can be changed or improved without departing from the gist thereof and includes equivalents thereof. That is, appropriate design changes made to the embodiments by those skilled in the art are also included in the scope of the present disclosure as long as the changes have features of the present disclosure. For example, the elements included in the embodiments, and the arrangements, materials, conditions, shapes, sizes, and so forth of the elements are not limited to those exemplified in the embodiments, and can be appropriately changed. Furthermore, the elements included in the embodiments can be combined as much as technically possible, and such combined elements are also included in the scope of the present disclosure as long as the combined elements have the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first transistor configured to amplify a first signal;
a second transistor configured to amplify a second signal, the second signal corresponding to an output signal of the first transistor;
a bias circuit configured to supply a bias current or a bias voltage to a base or a gate of the second transistor; and
an attenuation circuit configured to attenuate the first signal or the second signal based on a control voltage supplied from the bias circuit, wherein the attenuation circuit comprises:
a first diode element having an anode to which the control voltage is supplied,
a third transistor having a collector connected to a supply path of the first signal or a supply path of the second signal, an emitter connected to ground, and a base to which the control voltage is supplied from a cathode of the first diode element, and
a capacitor connected in parallel with the first diode element,
wherein the bias circuit is configured to decrease the supplied control voltage as a power level of the second signal increases, and
wherein the third transistor is configured to pass part of the first signal or the second signal from the collector of the third transistor to the emitter of the third transistor based on the control voltage.

2. A power amplifier circuit comprising:
a first transistor configured to amplify a first signal;
a second transistor configured to amplify a second signal, the second signal corresponding to an output signal of the first transistor;
a bias circuit configured to supply a bias current or a bias voltage to a base or a gate of the second transistor; and
an attenuation circuit configured to attenuate the first signal or the second signal based on a control voltage supplied from the bias circuit,
wherein the attenuation circuit comprises:
a first diode element having an anode to which the control voltage is supplied, and
a third transistor having a base to which the control voltage is supplied from a cathode of the first diode element, a collector connected to the base of the third transistor and connected to a supply path of the first signal or a supply path of the second signal, and an emitter connected to ground,
wherein the bias circuit is configured to decrease the supplied control voltage as a power level of the second signal increases, and
wherein the third transistor is configured to pass part of the first signal or the second signal from the collector of the third transistor to the emitter of the third transistor based on the control voltage.

3. The power amplifier circuit according to claim 1, wherein the bias circuit comprises a fourth transistor having an emitter from which the bias current or the bias voltage is output, and a base from which the control voltage is supplied.

4. The power amplifier circuit according to claim 2, wherein the bias circuit comprises a fourth transistor having an emitter from which the bias current or the bias voltage is output, and a base from which the control voltage is supplied.

5. A power amplifier circuit comprising:
a first transistor configured to amplify a first signal;
a second transistor configured to amplify a second signal, the second signal corresponding to an output signal of the first transistor;
a bias circuit configured to supply a bias current or a bias voltage to a base or a gate of the second transistor; and
an attenuation circuit configured to attenuate the first signal or the second signal based on a control voltage supplied from the bias circuit, wherein the attenuation circuit comprises:
a third transistor having a collector connected to a supply path of the first signal or a supply path of the second signal, a base to which the control voltage is supplied, and an emitter connected to ground,
wherein the bias circuit comprises:
a second diode element and a third diode element connected in series, a bias control voltage being supplied to an anode of the second diode element and a cathode of the third diode element being connected to ground, and
a fourth transistor having a base connected to the anode of the second diode element and an emitter from which the bias current or the bias voltage is output, wherein the control voltage is supplied from an anode of the third diode element to the base of the third transistor, and wherein the third transistor is configured to pass part of the first signal or the second signal from the collector of the third transistor to the emitter of the third transistor based on the control voltage.

6. The power amplifier circuit according to claim 1, wherein the attenuation circuit further comprises:

a fourth diode element connected in series with the supply path to which the collector of the third transistor is connected, and an inductor connected between a cathode of the fourth diode element and the ground.

7. The power amplifier circuit according to claim 2, wherein the attenuation circuit further comprises:

a fourth diode element connected in series with the supply path to which the collector of the third transistor is connected, and an inductor connected between a cathode of the fourth diode element and the ground.

8. The power amplifier circuit according to claim 5, wherein the attenuation circuit further comprises:

a fourth diode element connected in series with the supply path to which the collector of the third transistor is connected, and an inductor connected between a cathode of the fourth diode element and the ground.

9. The power amplifier circuit according to claim 1, wherein the first transistor or the second transistor is a field-effect transistor (FET).

10. The power amplifier circuit according to claim 2, wherein the first transistor or the second transistor is a field-effect transistor (FET).

11. The power amplifier circuit according to claim 5, wherein the first transistor or the second transistor is a field-effect transistor (FET).

* * * * *